United States Patent
Elsberg et al.

(10) Patent No.: US 8,188,998 B2
(45) Date of Patent: May 29, 2012

(54) SYSTEM AND METHOD OF PROXIMITY DETECTION

(76) Inventors: Nathan Elsberg, Modiin (IL); Alex Hazanov, Katzir (IL)

( * ) Notice: Subject to any disclaimer, the term of this patent is extended or adjusted under 35 U.S.C. 154(b) by 0 days.

(21) Appl. No.: 13/282,493

(22) Filed: Oct. 27, 2011

(65) Prior Publication Data

US 2012/0044248 A1    Feb. 23, 2012

Related U.S. Application Data

(62) Division of application No. 12/748,419, filed on Mar. 28, 2010, now abandoned, which is a division of application No. 11/538,103, filed on Oct. 3, 2006, now Pat. No. 7,692,649.

(60) Provisional application No. 60/723,011, filed on Oct. 4, 2005.

(51) Int. Cl.
    *G06T 15/00*    (2006.01)

(52) U.S. Cl. ............................................. 345/419

(58) Field of Classification Search .................... 345/419
    See application file for complete search history.

(56) References Cited

U.S. PATENT DOCUMENTS

| | | | |
|---|---|---|---|
| 5,832,106 A | 11/1998 | Kim | |
| 5,905,657 A | 5/1999 | Celniker | |
| 6,084,979 A | 7/2000 | Kanade et al. | |
| 6,128,577 A | 10/2000 | Assa et al. | |
| 6,313,837 B1 | 11/2001 | Assa et al. | |
| 6,421,116 B1 | 7/2002 | Schilli et al. | |
| 6,437,823 B1 | 8/2002 | Zhang | |
| 6,692,357 B2 | 2/2004 | Koizumi et al. | |
| 6,700,573 B2 | 3/2004 | Freeman | |
| 6,816,187 B1 | 11/2004 | Iwai et al. | |
| 6,910,001 B2 | 6/2005 | Hammersley et al. | |
| 6,930,715 B1 | 8/2005 | Mower | |
| 7,088,358 B2 * | 8/2006 | Aharon et al. ................ | 345/419 |
| 2002/0093538 A1 | 7/2002 | Carlin | |
| 2002/0144278 A1 | 10/2002 | Pratts et al. | |
| 2002/0154128 A1 * | 10/2002 | Zachmann .................... | 345/474 |
| 2003/0012409 A1 | 1/2003 | Overton et al. | |
| 2003/0103049 A1 | 6/2003 | Kindratenko et al. | |
| 2003/0112281 A1 * | 6/2003 | Sriram et al. ................. | 345/958 |
| 2004/0105573 A1 | 6/2004 | Neumann et al. | |
| 2005/0091016 A1 | 4/2005 | Godavarthy et al. | |
| 2007/0016372 A1 | 1/2007 | Browne et al. | |
| 2008/0012863 A1 | 1/2008 | Finn et al. | |
| 2008/0027684 A1 | 1/2008 | Inzinga et al. | |
| 2008/0229234 A1 | 9/2008 | Astolfi et al. | |

OTHER PUBLICATIONS

PD5D Smart Pack Manual (Published on the Internet Sep. 2003).

* cited by examiner

*Primary Examiner* — Xiao M. Wu
*Assistant Examiner* — Scott E Sonners
(74) *Attorney, Agent, or Firm* — Simon Kahn

(57) ABSTRACT

A computer implemented method of visualizing an infrastructure comprising: acquiring a cross section definition, the definition comprising points defining a link and link information, each of the points exhibiting a type; creating at least one three dimensional face linking points of a same type; assigning a face rendering for each of the created at least one three dimensional faces with a material definitional associated with the link information; and displaying the faces with the rendering. The invention also provides for a computing system operable to: acquire a cross section definition, the definition comprising points defining a link and link information, each of the points exhibiting a type; create at least one three dimensional face linking points of a same type; and assign a face rendering for each of the created at least one three dimensional faces with a material definitional associated with the link information.

13 Claims, 10 Drawing Sheets

US 8,188,998 B2

SYSTEM AND METHOD OF PROXIMITY DETECTION

CROSS-REFERENCE TO RELATED APPLICATION

This application claims priority from U.S. Provisional Patent Application Ser. No. 60/723,011 filed Oct. 4, 2005 entitled "A Virtual Reality Based System for the 3D Planning, Visualization and Analysis of Large Scale Engineering Projects in the Areas of Civil Engineering, Land Planning and Infrastructure Development" the entire contents of which are incorporated herein by reference.

BACKGROUND OF THE INVENTION

The invention relates generally to the field of computer aided design and geographic information systems, and in particular to a method of converting a computer aided design of a large scale project to a virtual reality based model.

Computer aided design (CAD) applications are used for both small and large scale products. For small scale projects, typically all the surfaces, shapes and interactions are defined by the user, and the application may generate a detailed 3 dimensional (3D) model which is viewable from any angle. The ability to view the model from any angle, effectively interacting with the model, is a key component in a virtual reality system.

A geographic information system (GIS) is a system for creating, storing, analyzing and managing spatial data and their associated attributes. Preferably a GIS is embodied in a computer system capable of integrating, storing, editing, analyzing, sharing, and displaying geographically-referenced information. In a typical embodiment a GIS is a tool that allows users to create interactive queries, analyze the spatial information, and edit data.

LandXML is an extensible markup language data file format containing civil engineering design and survey measurement data commonly used in the land development and civil engineering industries. LandXML files thus comprise a data format uniquely suited to large scale projects. LandXML is rapidly becoming the file format of choice for sharing and archiving of land design data.

Commercially, large scale projects on the order of civil engineering or land surveying projects have been accomplished with GIS systems. CAD applications have also been developed for use with these large scale projects, primarily due to their ease of use in developing and modifying precise drawings and maps. CAD and GIS visualization applications may provide photo-realistic results using techniques such as ray tracing, radiosity, global illumination and other shading, shadowing and light reflection techniques. Unfortunately, in large scale projects, and in particular those having GIS based data, these techniques are computationally intensive, and thus the photo-realistic results are viewable as a single raster image or stored as a series of raster images compiled in a time ordered sequence which may be viewed as a single animated playback. The computational intensiveness of the prior art thus does not allow for interaction with the model of large scale projects.

Civil engineering and land surveying projects would thus be greatly enhanced by an ability to evaluate large scale designs in a virtual reality environment. There is thus a long felt need for a method and apparatus linking CAD and GIS data to a virtual reality simulator system.

SUMMARY OF THE INVENTION

Accordingly, it is a principal object of the present invention to overcome the disadvantages of prior art systems for evaluating and interacting with large scale designs. This is provided for in the present invention by a method and apparatus for exporting and converting CAD and/or GIS data to a scene-graph abstraction of a virtual reality scene. 3D geometry information and assignments for lighting, coloring, texturing and shading is stored in the scene-graph preferably including an object hierarchy with uniquely identified objects and sub-objects in the scene-graph. In an exemplary embodiment animation control is provided for objects which move over time.

The invention further provides for a viewing application that takes the generated scene-graph and displays it on a monitor. In an exemplary embodiment the viewing application displays the scene-graph via a graphics card subsystem of a viewing computer. Preferably, all processing required for viewing of visual information occurs in the graphics pipeline of the viewing computer. Further preferably the graphics pipeline utilizes either OpenGL or DirectX protocols, with an optimizing decision regarding which of the protocols to be used being implemented at runtime.

In one embodiment, spatial analysis run in CAD and/or GIS systems and stored in associated files are exported and converted to the scene-graph. Thus, for example, roadway sight distances for stopping, passing and other critical maneuvers calculated in the CAD and/or GIS system may be viewed along with, and integrated into, the visual display of the scene-graph.

The invention provides for a computer implemented method of visually displaying geographic information system based data, the method comprising: acquiring a two dimensional representation of one or more objects to be displayed, the two dimensional representation being associated with one of a geographic information system and a computer aided design system; converting the acquired two dimensional representation of the one or more objects to a three dimensional entity representation; for each of the three dimensional entity representations, creating a definition node; and storing the three dimensional entity representations and the definition nodes in a scene-graph.

In one embodiment the stage of converting the acquired two dimensional representation comprises: determining, for each of the one or more objects, whether it is a link or a node. In another further embodiment the stage of converting the acquired two dimensional representation further comprises: in the event one of the one or more objects is determined to be a link, acquiring the 2 dimensional polyline along the link path; acquiring the 2 dimensional polyline profile for the link; generating for each vertex of the acquired 2 dimensional polyline along the link path a transformation for the acquired 2 dimensional polyline profile, the transformation comprising rotation form the positive z-axis to the tangential vector of the link path; copying each point of the acquired polyline profile into each vertex of the polyline along the link path while applying the generated transformation; and connecting all associated polyline profile points to form a three dimensional entity representation.

In one further embodiment the stage of converting the acquired two dimensional representation further comprises: in the event one of the one or more objects is determined to be a node, acquiring the 2 dimensional polyline profile of the node; acquiring the top and invert levels of the node; transforming each profile point by a transformation matrix representing node position with the z-axis component of the transformation matrix being equal to the acquired node top level; copying each transformed profile point to the invert level while applying a transformation matrix representing the difference between the acquired top level and the acquired invert level; and connecting all associated polyline profile points to form a three dimensional entity representation.

In one embodiment the method further comprises displaying the scene-graph on a monitor. In another embodiment the method further comprises: parsing each three dimensional entity representation and extracting the three dimensional faces; for each set of faces sharing an attribute, creating a mesh representation; and setting a material and texture for each mesh.

In one embodiment the method comprises: for each three dimensional entity representation, creating a bounding box; performing an intersection test with all other bounding boxes; for each face of each entity found to have an intersection by the performed intersection test, enlarging the face by a first predetermined value; and performing an intersection test with each of the enlarged faces. In one further embodiment the method further comprises displaying a marker at each found intersection by the performed intersection test of the enlarged faces. In another further embodiment the method further comprises setting the created bounding box to a second predetermined value. In one yet further embodiment the first predetermined value and the second predetermined value are substantially identical.

Independently the invention provides for a computing system for visually displaying geographic information system based data, comprising a computer, memory and monitor, the computer being operable to: acquire a two dimensional representation of one or more objects to be displayed, the two dimensional representation being associated with one of a geographic information system and computer aided design system; convert the acquired two dimensional representation of the one or more objects to a three dimensional entity representation; store the three dimensional entity representation of the one or more objects in a scene-graph in the memory; and display the scene-graph on the monitor.

In one embodiment the operation to convert the acquired two dimensional representation comprises: determine, for each of the one or more objects, whether it is a link or a node. In a further embodiment the operation to convert the acquired two dimensional representation further comprises: in the event one of the one or more objects is determined to be a link, acquire the 2 dimensional polyline along the link path; acquire the 2 dimensional polyline profile for the link; generate for each vertex of the acquired 2 dimensional polyline along the link path a transformation for the acquired 2 dimensional polyline profile, the transformation comprising rotation form the positive z-axis to the tangential vector of the link path; copy each point of the acquired polyline profile into each vertex of the polyline along the link path while applying the generated transformation; and connect all associated polyline profile points to form a three dimensional entity representation. In another further embodiment the operation to convert the acquired two dimensional representation further comprises: in the event one of the one or more objects is determined to be a node, acquire the 2 dimensional polyline profile of the node; acquire the top and invert levels of the node; transform each profile point by a transformation matrix representing node position with the z-axis component of the transformation matrix being equal to the acquired node top level; copy each transformed profile point to the invert level while applying a transformation matrix representing the difference between the acquired top level and the acquired invert level; and connect all associated polyline profile points to form a three dimensional entity representation.

In one embodiment the computer is further operable to display the scene-graph on the monitor. In another embodiment the computer is further operable to: parse each three dimensional entity representation and extracting the three dimensional faces; for each set of faces sharing an attribute, create a mesh representation; and set a material and texture for each mesh.

In one embodiment the computer is further operable to: for each three dimensional entity representation, create a bounding box; perform an intersection test with all other bounding boxes; for each face of each entity found to have an intersection by the performed intersection test, enlarge the face by a first predetermined value; and perform an intersection test with each of the enlarged faces. In one further embodiment the computer is further operable to display a marker at each found intersection by the performed intersection test of the enlarged faces, the marker being displayed on the monitor overlaying the scene-graph. In another further embodiment the computer is further operable to set the created bounding box to a second predetermined value. In yet another further embodiment the first predetermined value and the second predetermined value are substantially identical.

Independently the invention provides for a computer implemented method of proximity detection comprising: defining a set of three dimensional entities in a screen-graph for analysis; for each entity in the defined set, creating a bounding box; setting the creating bounding box to a first predetermined value; for each of set created bounding boxes, performing an intersection test with at least one other bounding box; in the event that an intersection is found by the performed intersection test, for each face of each entity in the intersection enlarging the face by a second predetermined value; for each of the enlarged face, performing an intersection test with each of the other enlarged faces; and in the event that an intersection is found by the performed intersection test of the enlarged faces, marking a collision.

In one embodiment the first predetermined value is substantially the same as the second predetermined value. In one further embodiment the first and second predetermined values are a proximity value determining a collision.

Independently the invention provides for a computing system for visually displaying proximity detection, comprising a computer and a monitor, the computer being operable to: define a set of three dimensional entities in a screen-graph for analysis; for each entity in the defined set, create a bounding box; set the creating bounding box to a first predetermined value; for each of set created bounding boxes, perform an intersection test with at least one other bounding box; in the event that an intersection is found by the performed intersection test, for each face of each entity in the intersection enlarge the face by a second predetermined value; for each of the enlarged face, perform an intersection test with each of the other enlarged faces; and in the event that an intersection is found by the performed intersection test of the enlarged faces, mark a collision by displaying the collision on the monitor overlaying a display of the screen-graph.

In one embodiment the first predetermined value is substantially the same as the second predetermined value. In another embodiment the first and second predetermined values are a proximity value determinative of a collision.

Independently the invention provides for a computer implemented method of visualizing an infrastructure comprising: acquiring a cross section definition, the definition comprising points defining a link and link information, each of the points exhibiting a type; creating at least one three dimensional face linking points of a same type; assigning a face rendering for each of the created at least one three dimensional faces with a material definitional associated with the link information; and displaying the faces with the rendering.

In one embodiment the acquired cross section definition defines one of a corridor, railway, tunnel and a road surface. In another embodiment the stage of creating at least one three dimensional faces comprises creating a pair of opposing triangular shaped faces.

In one embodiment the stage of creating comprises: selecting a first cross section of the acquired cross section definition; selecting a second cross section of the acquired cross section definition; selecting a pair of points on the first cross section defining a link, the pair of points comprising a first point closer to a centerline of the selected first cross section than a second point; and searching for a pair of points on the second cross section exhibiting the same type as the selected pair of points on the first cross section, wherein in the event that the pair of points on the second cross section is found exhibiting the same type as the selected pair of points on the first cross section, the creating is performed on the pair of points on the first cross section and the pair of points on the second cross section.

In one further embodiment the method further comprises in the event that the pair of points on the second cross section is not found exhibiting the same type as the selected pair of points on the first cross section, searching for a single point on the second cross section whose type is equal to the second point of the selected first cross section. In one yet further embodiment the method further comprises in the event that the single point on the second section whose type is equal to the second point of the selected first cross section is found, the creating is accomplished as triangular faces between the single point on the second cross section to the pair of points on the first cross section, and further comprising creating triangular faces from points between the single point and the centerline to the first point of the selected first cross section. In a yet further embodiment the method further comprises in the event that the single point on the second section whose type is equal to the second point of the selected first cross section is not found: selecting a pair of points on the second cross section defining a link, the pair of points comprising a first point closer to a centerline of the selected first cross section than a second point; and searching for a single point on the first cross section whose type is equal to the second point of the selected second cross section, wherein the creating is accomplished as triangular faces between the single point on the first cross section to the pair of points on the second cross section, and further comprising creating triangular faces from points between the single point and the centerline to the first point of the selected second cross section.

Independently the invention provides for a computing system for visualizing an infrastructure, comprising a computer and a monitor, the computer being operable to: acquire a cross section definition, the definition comprising points defining a link and link information, each of the points exhibiting a type; create at least one three dimensional face linking points of a same type; assign a face rendering for each of the created at least one three dimensional faces with a material definitional associated with the link information; and display the faces with the rendering.

In one embodiment the cross section definition defines one of a corridor, railway, tunnel and a road surface. In another embodiment the operation to create at least one three dimensional faces comprises being operable to create a pair of opposing triangular shaped faces.

In one embodiment the operation to create at least one three dimensional faces comprises being operable to: select a first cross section of the acquired cross section definition; select a second cross section of the acquired cross section definition; select a pair of points on the first cross section defining a link, the pair of points comprising a first point closer to a centerline of the selected first cross section than a second point; and search for a pair of points on the second cross section exhibiting the same type as the selected pair of points on the first cross section, wherein in the event that the pair of points on the second cross section is found exhibiting the same type as the selected pair of points on the first cross section, the operation to create is performed on the pair of points on the first cross section and the pair of points on the second cross section.

In one further embodiment in the event that the pair of points on the second cross section is not found exhibiting the same type as the selected pair of points on the first cross section, the computer is operable to search for a single point on the second cross section whose type is equal to the second point of the selected first cross section. In one yet further embodiment in the event that the single point on the second section whose type is equal to the second point of the selected first cross section is found, the operation to create is accomplished as triangular faces between the single point on the second cross section to the pair of points on the first cross section, and the computer is further operable to create triangular faces from points between the single point and the centerline to the first point of the selected first cross section. In a yet further embodiment in the event that the single point on the second section whose type is equal to the second point of the selected first cross section is not found, the computer is further operable to: select a pair of points on the second cross section defining a link, the pair of points comprising a first point closer to a centerline of the selected first cross section than a second point; and search for a single point on the first cross section whose type is equal to the second point of the selected second cross section, wherein the operation to create is accomplished as triangular faces between the single point on the first cross section to the pair of points on the second cross section, and further comprising creating triangular faces from points between the single point and the centerline to the first point of the selected second cross section.

Independently the invention provides for a method of sight distance analysis comprising: acquiring an infrastructure as a scene-graph comprising three dimensional entities; acquiring a nominal location for a moving observer in relation to a path on the infrastructure; acquiring a distance to a target, the target being maintained at the distance from the moving observer; calculating for a plurality of points along the path on the infrastructure a straight line between the moving observer and the target; defining a 2 dimensional polyline representation of a visual intrusion zone; and projecting the visual intrusion zone on a representation of the scene-graph.

In one embodiment the visual intrusion zone is a function of all of the calculated straight lines. In another embodiment the visual intrusion zone forms a closed polygon.

Independently the invention provides for a computing system for sight distance analysis comprising a computer and a monitor, the computer being operable to: acquire an infrastructure as a scene-graph comprising three dimensional entities; acquire a nominal location for a moving observer in relation to a path on the infrastructure; acquire a distance to a target, the target being maintained at the distance from the moving observer; calculate for a plurality of points along the path on the infrastructure a straight line between the moving observer and the target; define a 2 dimensional polyline representation of a visual intrusion zone; and project the visual intrusion zone on a representation of the scene-graph on the monitor.

In one embodiment the visual intrusion zone is a function of all of the calculated straight lines. In another embodiment the visual intrusion zone forms a closed polygon.

Independently the invention provide for a method of sight distance analysis comprising: acquiring an infrastructure as a scene-graph comprising three dimensional entities; acquiring at least one three dimensional object representation within the infrastructure environment, the object representation comprising a measure of transparency; creating an animation path along the infrastructure in a virtual reality simulator; positioning a visible target object within the virtual reality simulator, the visible target object being maintained at a fixed distance from an observer; and viewing the target object while moving the observer along the created animation path.

In one embodiment the method further comprises generating a report for a plurality points along the created animation path, the report comprising observer position, target position and percentage of target which is visible by the observer at each of the plurality of points. In another embodiment the method further comprises: generating a report for a plurality points along the created animation path, the report comprising observer position, target position and percentage of target which is visible by the observer at each of the plurality of points, the percentage of target which is visible being a function of the measure of transparency.

Independently the invention provides for a computing system for sight distance analysis comprising a computer and a monitor in communication therewith, the computer being operable to: acquire an infrastructure as a scene-graph comprising three dimensional entities; acquire at least one three dimensional object representation within the infrastructure environment, the object representation comprising a measure of transparency; create an animation path along the infrastructure in a virtual reality simulator; position a visible target object within the virtual reality simulator, the visible target object being maintained at a fixed distance from an observer; and view the target object while moving the observer along the created animation path.

In one embodiment the computer is further operable to generate a report for a plurality points along the created animation path, the report comprising observer position, target position and percentage of target which is visible by the observer at each of the plurality of points. In another embodiment the computer is further operable to generate a report for a plurality points along the created animation path, the report comprising observer position, target position and percentage of target which is visible by the observer at each of the plurality of points, the percentage of target which is visible being a function of the measure of transparency.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawing.

DETAILED DESCRIPTION OF THE PREFERRED EMBODIMENTS

Figure 1:
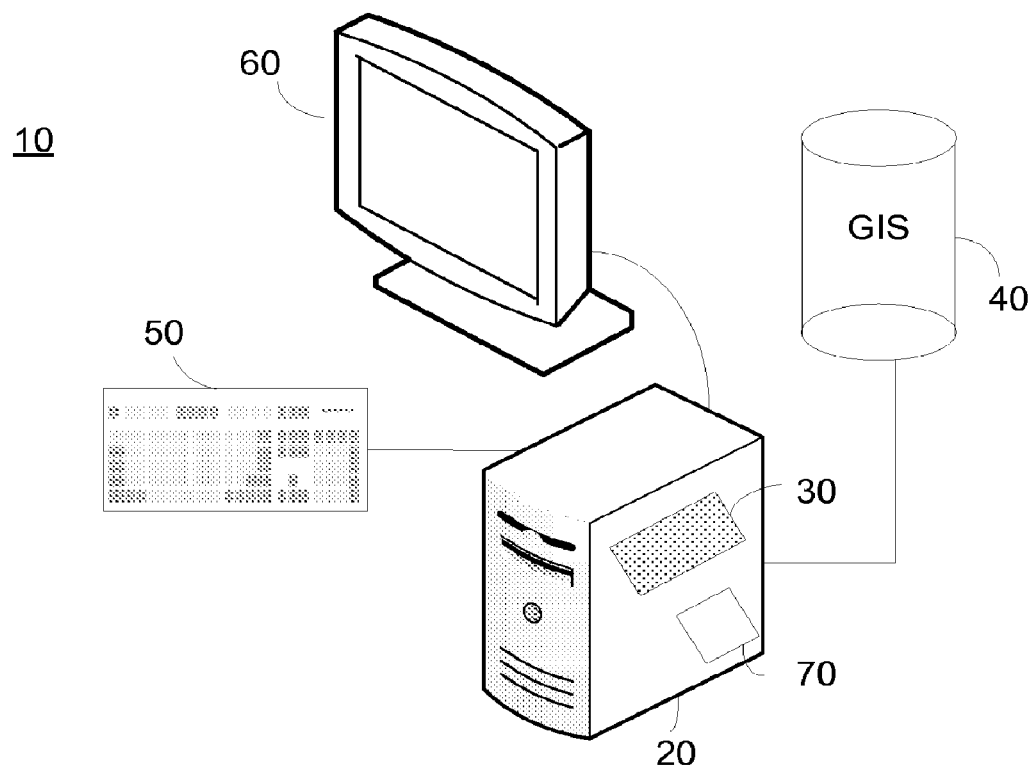
FIG. 1 illustrates a high level block diagram of a computing platform in accordance with a principle of the current invention.

The present embodiments enable a method and apparatus for exporting and converting CAD and/or GIS data to a scene-graph abstraction of a virtual reality scene. 3D geometry information and assignments for lighting, coloring, texturing and shading is stored in the scene-graph preferably including an object hierarchy with uniquely identified objects and sub-objects in the scene-graph. In an exemplary embodiment animation control is provided for objects which move over time.

The invention further provides for a viewing application that takes the generated scene-graph and displays it on a monitor. In an exemplary embodiment the viewing application displays the scene-graph via a graphics card subsystem of a viewing computer. Preferably, all processing required for viewing of visual information occurs in the graphics pipeline of the viewing computer. Further preferably the graphics pipeline utilizes either OpenGL or DirectX protocols, with an optimizing decision regarding which of the protocols to be used being implemented at runtime.

In one embodiment, spatial analysis run in CAD and/or GIS systems and stored in associated files are exported and converted to the scene-graph. Thus, for example, roadway sight distances for stopping, passing and other critical maneuvers calculated in the CAD and/or GIS system may be viewed along with, and integrated into, the visual display of the scene-graph.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level block diagram of a computing platform 10 in accordance with a principle of the current invention comprising a computing device 20 comprising a graphics card 30 and a memory 70, a GIS or CAD database memory device 40, a user input device 50 and a monitor 60. Monitor 60 is connected to the output of graphics card 30 and computing device 20 is connected to user input device 50 and GIS or CAD database memory device 40. User input device 50 is illustrated as a keyboard, however this is not meant to be limiting in any way. The use of any or all of a pointing device, a voice input, or a touch screen are equally applicable and are specifically included. GIS or CAD database memory device 40 is illustrated as being external to computing device 20, such as a network server, however this is not meant to be limiting in any way. GIS or CAD database memory device 40 may be internal to computing device 20 without exceeding the scope of the invention. GIS or CAD database memory device 40 comprise GIS and/or CAD files and computing device 20 is operable to convert to the GIS and/or CAD files to 3D virtual-reality screen graphs for viewing on monitor 60. Memory 70 of computing device 20 is operable to store the method according the principle of the invention in computer readable format for execution by computing device 20. Memory 70 may be co-located with GIS or CAD database memory device 40 without exceeding the scope of the invention.

In operation, computing device 20 is operable to obtain GIS or CAD files from GIS database memory device 40, and translate the GIS based information to three dimensional (3D) views for display on monitor 60. Preferably, the translation is performed optimized for graphics card 30. User inputs are obtained from user input device 30, or via a connected network (not shown).

Figure 2A:
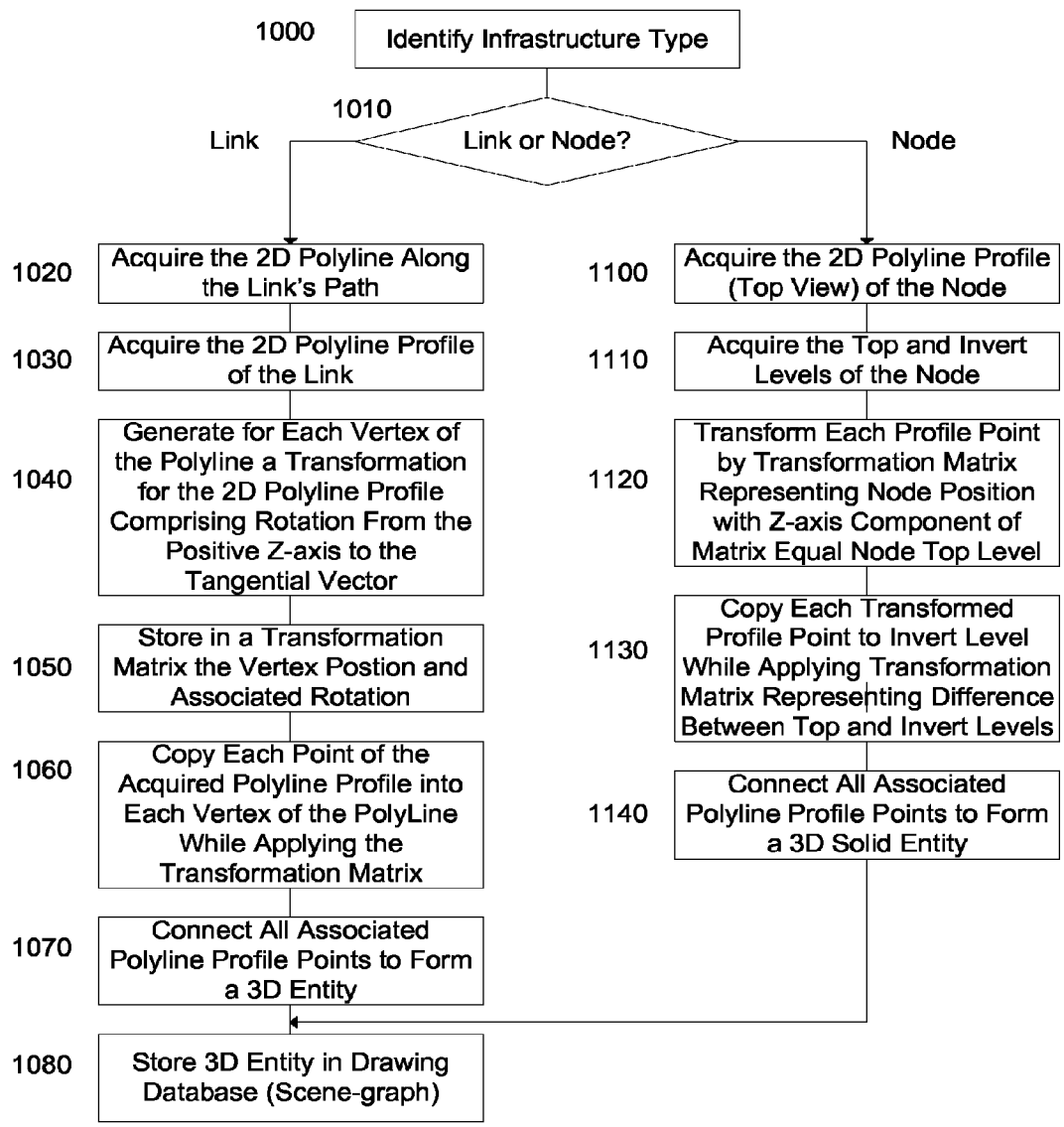
FIG. 2A illustrates a high level flow chart of a method of converting GIS information representing underground infrastructure to a three dimensional visual entity in accordance with a principle of the current invention.

FIG. 2A illustrates a high level flow chart of a method of converting GIS or CAD information representing an underground structure to a 3D visual entity in accordance with a principle of the current invention. In an exemplary embodiment GIS or CAD information is stored on GIS or CAD database memory 40 as a GIS or CAD database. The method is additionally stored on memory 70 of computing platform 10 in a computer readable format, and the method is specifically designed to be implemented by computing device 20 of computing platform 10.

In stage 1000 the infrastructure entity type is identified. In particular each object in the infrastructure to be displayed is identified and flagged as one of a link object or a node object. In one embodiment the GIS or CAD database identifies each entity as one of a link object and a node object. In another embodiment, the user identifies each entity as one of a link object and a node object. In yet another embodiment each entity in the GIS or CAD database is identified by attributes thereof, in particular a link is identified by the polyline definition and the node is identified by the polyline profile.

In stage 1010 the flag associated with the object in stage 1000 is examined to determine if it is a link object or a node object. In the event that it is a link object, in stage 1020 the 2D polyline along the path of the link is acquired. In one embodiment the 2D polyline is selected interactively from the 2D representation of the GIS or CAD database stored on GIS or CAD database memory device 40, which in a preferred embodiment comprises a LandXML data file. In another embodiment, the polyline is loaded from an external database. In yet another embodiment the 2D points forming each section of the polyline are manually entered by a user utilizing input device 50.

In stage 1030 the 2D polyline profile of the link is acquired from the GIS database stored on GIS database memory device 40, which in a preferred embodiment comprises a LandXML data file. In another embodiment, the polyline profile is loaded from an external database. In yet another embodiment the 2D points forming each section of the polyline are manually entered by a user utilizing input device 50.

In stage 1040 for each vertex of the polyline acquired in stage 1020, a transformation is generated for the 2D polyline profile. The transformation comprises the transformation to the current vertex position and the rotation from the up vector in the positive Z direction to the tangential vector at the vertex location. In stage 1050 the transformation of stage 1040 comprising the vertex position transformation and rotation is stored in a transformation matrix. In an exemplary embodiment the transformation matrix is stored on memory 70 of computing platform 10 of FIG. 1.

Figure 2B:
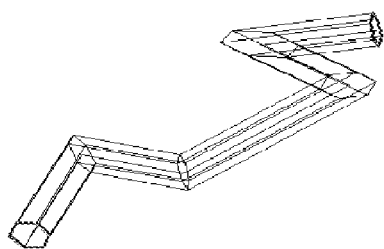
FIGS. 2B-2C illustrate stages in converting GIS information associated with a link entity to a three dimensional visual entity in accordance with a principle of the current invention.

In stage 1060, each point of the polyline profile acquired in stage 1030 is copied into each vertex of the polyline acquired in stage 1020, while applying the associated transformation matrix stored in stage 1050. The operation of stage 1060 is illustrated graphically in FIG. 2B, in which a polyline profile is shown copied into each vertex of the polyline.

Figure 2C:
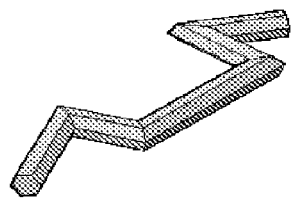

In stage 1070, all associated polyline profile points are connected to form a 3D entity as illustrated in FIG. 2C.

In stage 1080, the 3D entity formed in stage 1070 is stored in a drawing database.

In the event that in stage 1010 the flag associated with the object in stage 1000 is indicative of a node object, in stage 1100 the 2D polyline profile of the node is acquired. In an exemplary embodiment the 2D polyline profile is acquired from the GIS or CAD database stored on GIS database memory device 40, which in a preferred embodiment comprises a LandXML data file. In another embodiment, the polyline profile is loaded from an external database. In yet another embodiment the 2D points forming each vertex of the polyline profile are manually entered by a user utilizing input device 50. In stage 1110, the top and invert levels for the node object are further acquired from the GIS or CAD database stored on GIS or CAD database memory device 40 which in a preferred embodiment comprises a LandXML data file. In another embodiment, the polyline is loaded from an external database. In yet another embodiment the points forming each vertex of the top and invert levels of the polyline profile are manually entered by a user utilizing input device 50.

Figure 2D:
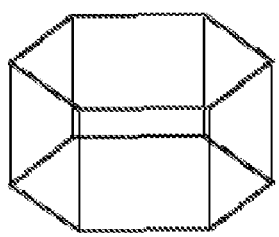
FIGS. 2D-2E illustrate stages in converting GIS information associated with a node entity to a three dimensional visual entity in accordance with a principle of the current invention.

In stage 1120 each profile point of the polyline profile is transformed by a transformation matrix representing the node position while the Z-axis component of the transformation matrix represents the top level of the node object acquired in stage 1110. In stage 1130, each profile point of the polyline profile is copied to the invert level while applying the transformation matrix that represents the difference between the top and invert levels in the negative Z-axis direction. The operation of stage 1130 is illustrated in FIG. 2D, in which each profile point of the polyline profile has been copied to the invert level while applying the transformation matrix representing the difference between the top and invert levels in the negative Z-axis direction.

Figure 2E:
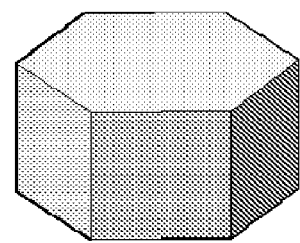

In stage 1140 all associated polyline profile points are connected to form a 3D solid entity. The operation of stage 1140 is illustrated in FIG. 2E in which the associated polyline profile points of FIG. 2D have been connected to form a 3D solid entity.

In stage 1080, the 3D entity formed in stage 1140 is stored in a 3D drawing database.

Figure 3:
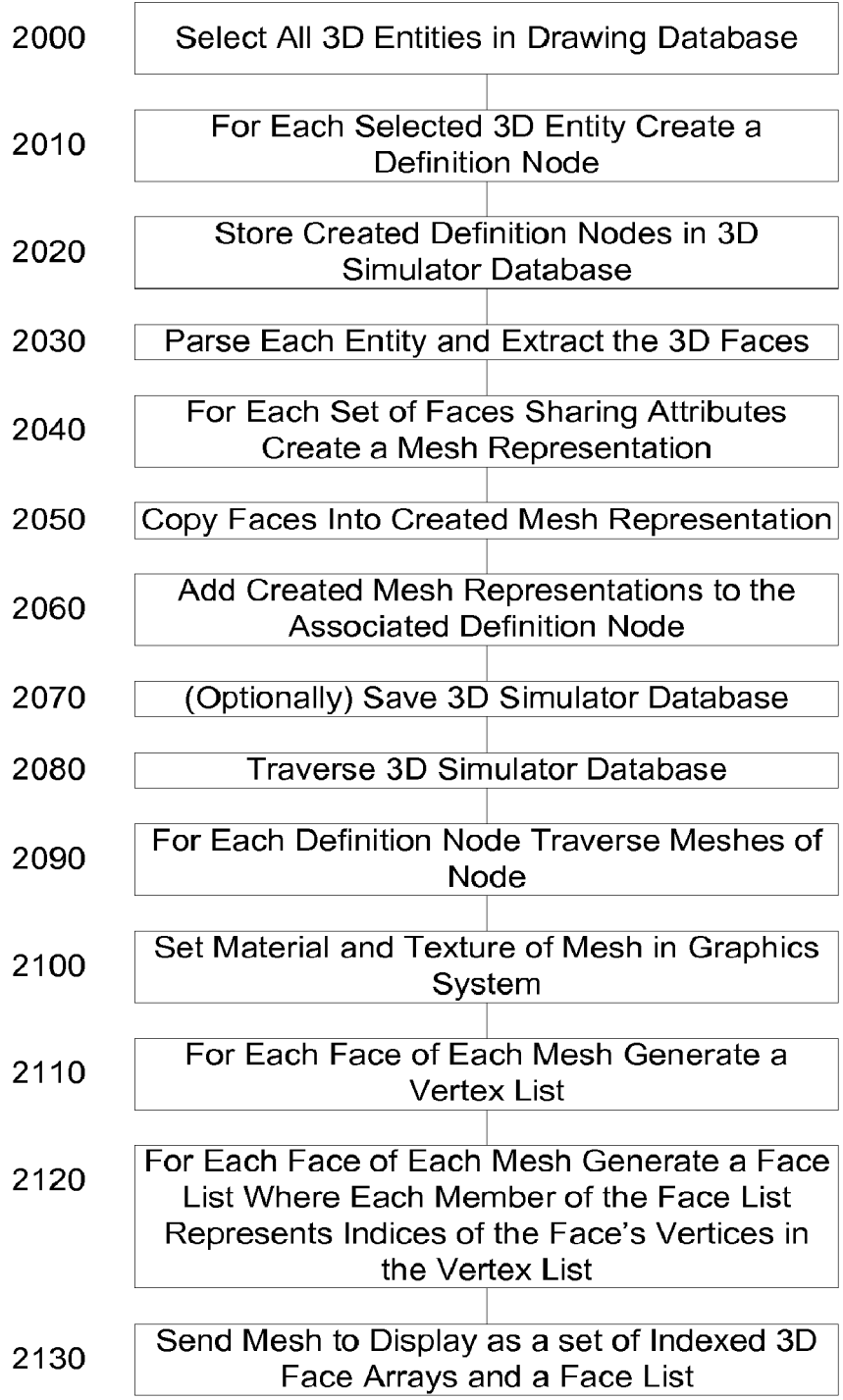
FIG. 3 illustrates a high level flow chart, in accordance with a principle of the current invention, of a method of displaying and simulating in a virtual reality setting the three dimensional entities of FIG. 2A.

FIG. 3 illustrates a high level flow chart, in accordance with a principle of the current invention, of a method of displaying and simulating in a virtual reality setting the three dimensional entities of FIG. 2A. In an exemplary embodiment the 3D entities transformed by repeated operation of the method of FIG. 2A on all objects in the GIS based infrastructure to be displayed are stored in a drawing database known as a scene-graph. Preferably, the drawing database is stored in a non-volatile portion of memory 70 of computing platform 10 of FIG. 1. In another embodiment the method of FIG. 3 is performed on a drawing database of 3D entities formed by a computer aided design application without the implementation of the method of FIG. 2A.

In stage 2000, all 3D entities of interest in the drawing database are selected. In one embodiment a user selects all entities as a default selection. In another embodiment a user may select one or more sets of entities. In stage 2010, a definition node is created for each 3D entity found and selected in stage 2000. In stage 2020 the definition nodes created in stage 2010 are stored in a 3D simulator database. The 3D simulator database is also known as a scene-graph.

In stage 2030 each 3D entity selected in stage 2000 is parsed, and the 3D faces are extracted from the definition of the 3D entity stored in stage 1080 of FIG. 2A. The term face is meant to define a plane defined by 3 vertices each with a unique x,y,z coordinate. In stage 2040, for each set of faces which share at least one attribute a mesh representation is created. The attributes which are shared may be any of material, texture, color or other attributes found in the definition of the 3D entity stored in stage 1080. In the event that a particular face does not share a representation with any other face, a mesh representation consisting of a single face is created In stage 2050 the 3D faces extracted in stage 2030 are copied into the mesh representation created in stage 2040. In stage 2060, the mesh representations created in stage 2040 and having the 3D faces copied therein as described above in relation to stage 2050, are added to the associated definition nodes created in stage 2010 and stored in the 3D simulator database.

In optionally stage 2070, the simulator database is saved, preferably on a non-volatile section of memory 70 of computing platform 10 of FIG. 1. The simulator database is also known as a scene-graph. Saving the simulator scenegraph is advantageous as it allows for loading the scene-graph for viewing in a simulator application without the need to regenerate the scene-graph from the initial drawing. Further advantageously, the scene-graph may be shared over a network to be viewed by a simulator application not having the capabilities, available computing power or access to initial data required to generate the scene-graph.

In stage 2080 the 3D simulator database is traversed. In the event that stage 2070 was performed, optionally, the saved simulator database is restored prior to performing stage 2080. In stage 2090, for each definition node found in the 3D simulator database, the mesh representation associated with the node is traversed. In stage 2100, the material and texture to be displayed in the graphics system of graphics card 30 of FIG. 1 is set. Preferably the material and texture is defined automatically based upon initial attribute of the drawing with created the mesh, such as a specific layer assignment or other defining data indicating the visual characteristics of the mesh. Further preferable the material and textures are defined in concert with the graphics system represented by graphics card 30. In an exemplary embodiment the graphics system is one of OpenGL or DirectX.

In stage 2110, for each face of each mesh, generate a vertex list. In stage 2120, for each face of each mesh, generate a face list, where each member of the face list represents indices of the face's vertices in the vertex list generated in stage 2110. In stage 2130, send the mesh to display card 30 for display on monitor 60 as a set of indexed 3D face arrays and a face list.

Figure 4:
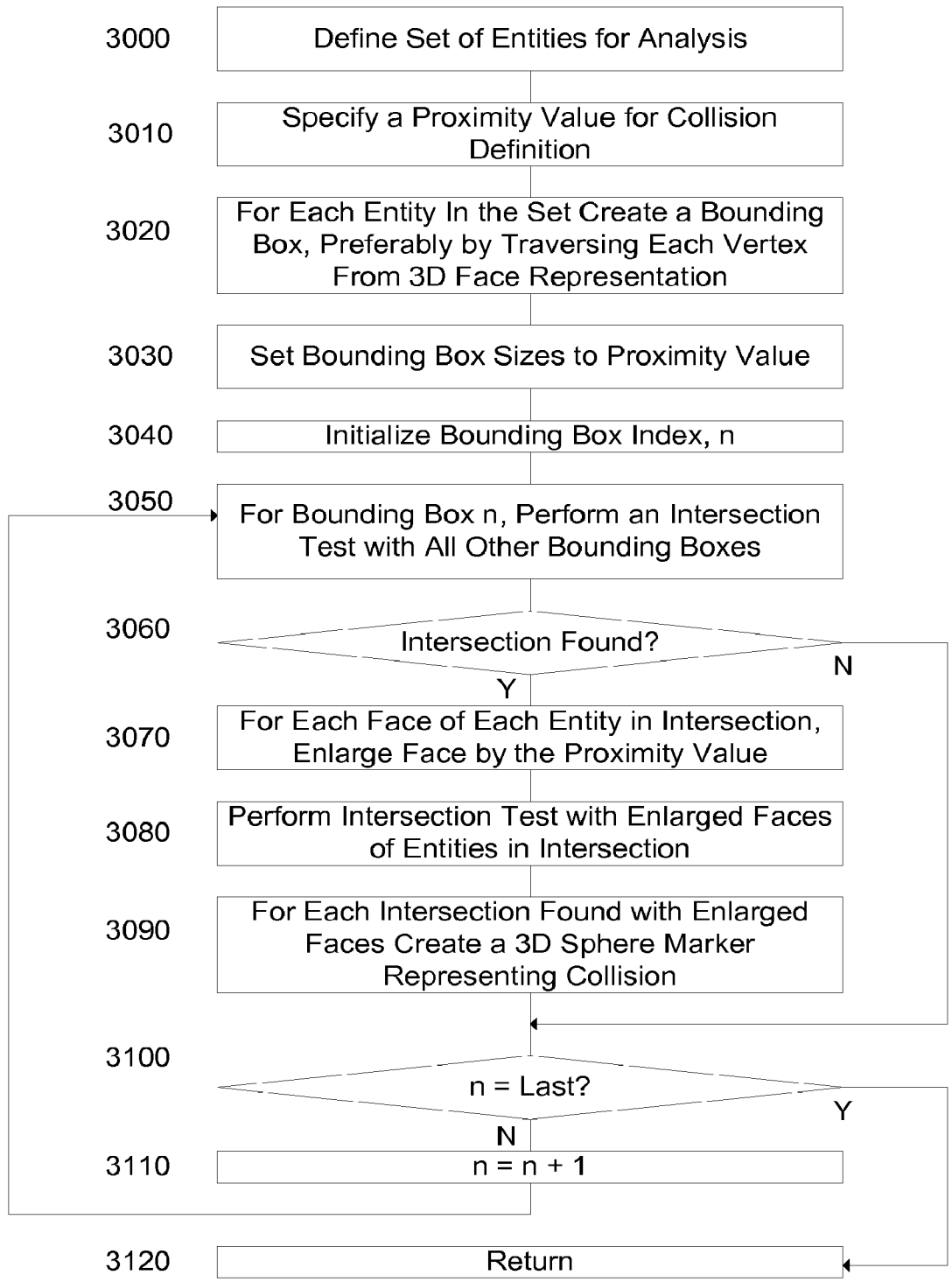
FIG. 4 illustrates a high level flow chart, in accordance with a principle of the current invention, of a method of analyzing structures to identify collisions and proximity violations.

FIG. 4 illustrates a high level flow chart, in accordance with a principle of the current invention, of a method of analyzing an underground structure to identify collisions or proximity. The method of FIG. 4 is operable on a database of 3D items, such as a scene-graph created in the method of FIG. 2A.

In stage 3000, the set of 3D entities for analysis is defined. In one embodiment the set of entities are defined manually. In another embodiment a specific layer in the scene-graph is defined. In yet another embodiment all entities with a common specific property are defined.

In stage 3010, a proximity value for collision detection is specified. In one embodiment a user specified the proximity value via input device 50. In another embodiment a default choice for proximity value is specified in the absence of a user input via input device 50.

In stage 3020, for each entity in the set defined in stage 3000, a bounding box is created. Preferably, the bounding box is created by traversing each vertex from the vertex's 3D face representation. In stage 3030, the bounding box is enlarged to the proximity value defined in stage 3010.

In stage 3040, an index, n, for bounding boxes is initialized. In stage 3050, for bounding box n, an intersection test is performed with all other bounding boxes.

In stage 3060, the intersection test of stage 3050 is examined to determine if any intersections were found. In the event that at least one intersection was found, in stage 3070, for each face of each entity in the intersection, enlarge the face by the proximity value specified in stage 3010. Preferably, the face is enlarged by moving each vertex of the face along its normal axis by the specified proximity value to ensure the scale is uniform in all possible directions.

In stage 3080, an intersection test is performed with the enlarged face of stage 3070 against all other faces of each entity in the intersection found in stage 3060. In stage 3090, for each intersection found in the intersection test of stage 3080 a marker is placed representing a collision. Preferably the marker is a 3D sphere of a predetermined color.

In stage 3100, bounding box index n is examined to see if n=last box. In the event that n does not equal the last box, in stage 3110 bounding box index n is indexed by 1 and stage 3050 as described above is performed.

In the event that in stage 3110, n=last box, than in stage 3120 the routine of FIG. 4 returns.

In the event that in stage 3060 no intersections were found, stage 3100 as described above is performed.

Thus, all selected entities are tested for an intersection, and intersections within the specified proximity value are marked with a visual marker, and their positions indicated in a textual report outputted.

Figure 5A:
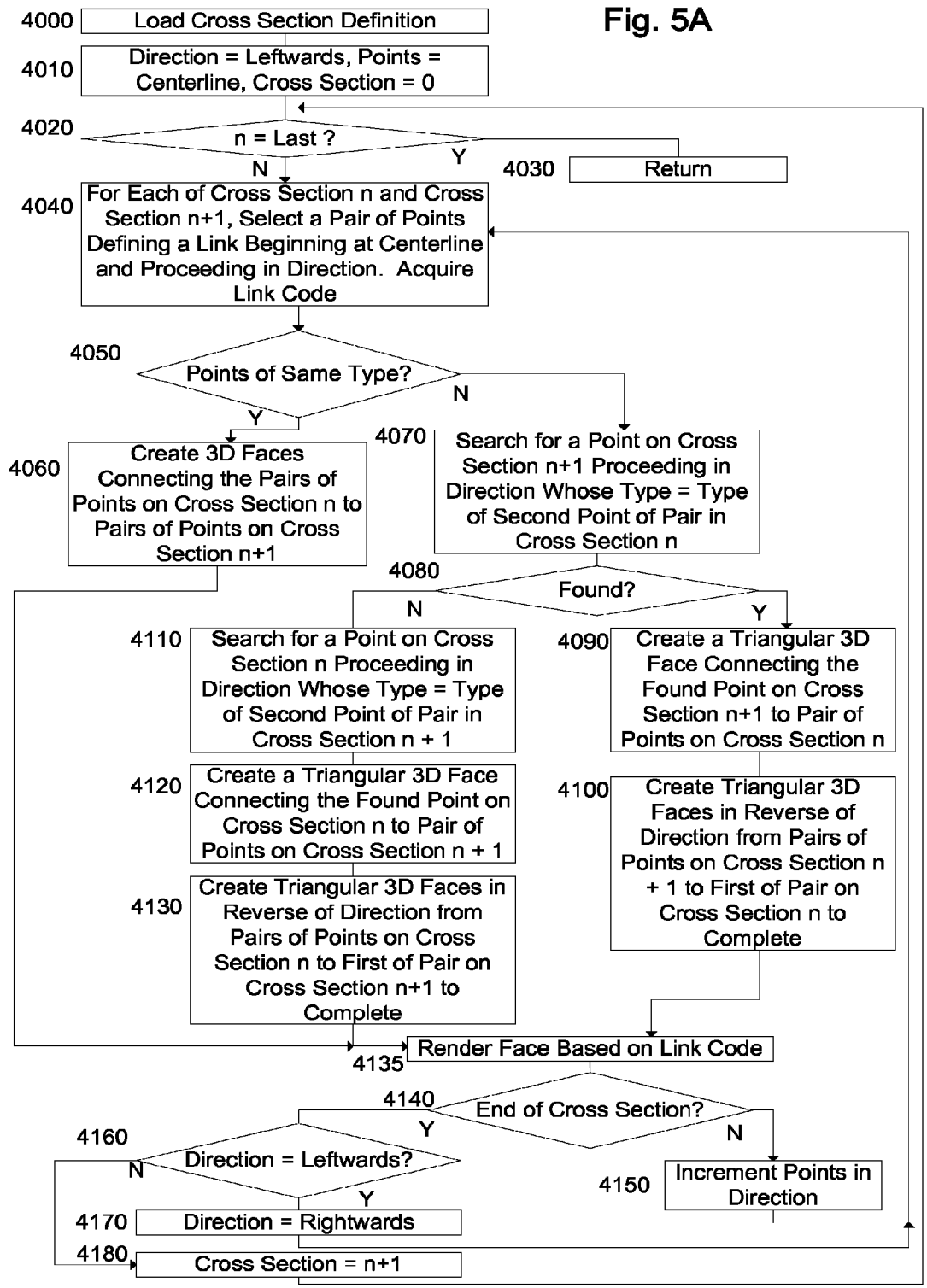
FIG. 5A illustrates a high level flow chart, in accordance with a principle of the current invention, of a method of converting GIS information representing a proposed roadway, railway, tunnel or other designed corridor to a three dimensional visual entity.

FIG. 5A illustrates a high level flow chart, in accordance with a principle of the current invention, of a method of converting GIS information representing a proposed road surface to a three dimensional visual entity. A proposed road surface according to the prior art comprises a set of points, each point having associated therewith at least three attributes: distance from center line; elevation; and type. A proposed road surface may be presented in a 3D drawing in the prior art, however there is no implementation allowing for texture of various surfaces and virtual reality simulation. In particular is not possible in prior art implementations to interactively view a 3D drawing of the proposed road surface from any angle or location, to interact with the drawing so as to visualize sight distances to a pre-determined object, or to simulate virtual motion along the road surface while calculated sight distances to a pre-determined object.

In stage 4000, the road cross section definitions are loaded. In one embodiment the cross sections are manually defined, and in another embodiment the cross section are loaded from a LandXML formatted file, preferably stored on GIS or CAD database memory device 40 of FIG. 1. In yet another embodiment the road cross section definitions are loaded from an external database.

In stage 4010, the direction is initialized to leftwards from the centerline, the points are initialized to correspond with the centerline, and the cross section index, n, is initialized to zero. The invention is herein being described as proceeding initially leftwards from the centerline, however this is not meant to be limiting in any way. The invention may be practiced proceeding initially rightwards from the centerline without exceeding the scope of the invention.

In stage 4020, cross section index n is examined to see whether n=last cross section. In the event that n=last cross section, i.e. the proposed road surface has been prepared to be visualized as a three dimensional visual entity, in stage 4030 the method return.

In the event that in stage 4020 the cross section index n is not equal to the last cross section, in stage 4040 for each of cross section n and cross section n+1, select a pair of points defining a link beginning at the centerline and proceeding in the defined direction. Preferably, a link code indicative of the appropriate material definition of the surface defined by the pair of points is acquired. In one embodiment this is acquired as part of stage 4000, and in another embodiment this is acquired by user selection. The surface definition is used, as will be described further hereinto below to render the generated face with an appropriate material definition. The pair of points are indexed, as will be described further hereinto below, by an index pointer, p. In stage 4050 the pair of points selected for cross section n and the pair of points selected for cross section n+1, as indicated by index pointer p, are compared to see if they are of the same type.

Figure 5B:
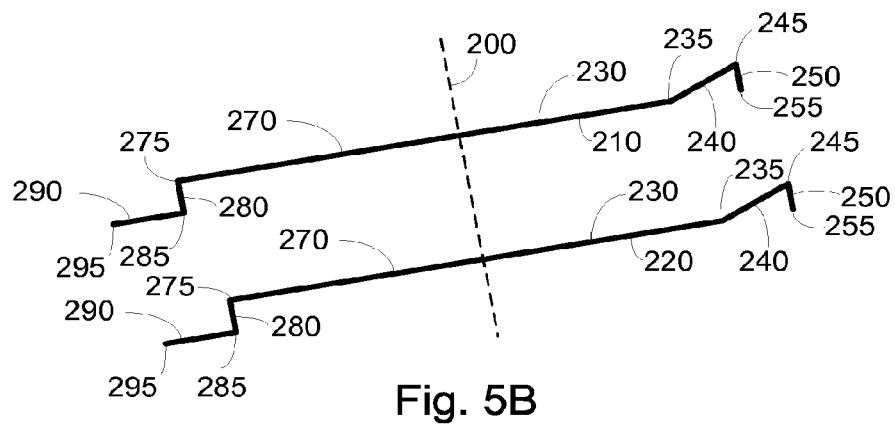
FIGS. 5B-5C illustrate stages in converting GIS information associated with a proposed road surface to a three dimensional visual entity in accordance with a principle of the current invention where the pairs of points are of the same type.

FIG. 5B illustrates a proposed road surface wherein the pairs of points of section n and section n+1 are of the same type comprising a centerline 200, a first cross section 210 and a second cross section 220. Each of first cross section 210 and second cross section 220 exhibit: a link 230 extending rightwards from centerline 200 to a retrograde start point 235; a retrograde link 240 extending generally rightwards from retrograde start point 235 to a gutter start point 245; a gutter link 250 extending generally rightwards from gutter start point 245 to a road end point 250; a link 270 extending leftwards from centerline 200 to a retrograde start point 275; a retrograde link 280 extending generally leftwards from retrograde start point 275 to a gutter start point 285; and a gutter link 290 extending generally leftwards from gutter start point 285 to a road end point 295. Cross sections 210 and 220 may exhibit different elevations and distances from centerline 200 for each of the points 235, 245, 255, 275, 285 and 295, however cross sections 210 and 220 share a common set of points having the same type in order from the centerline.

Figure 5C:
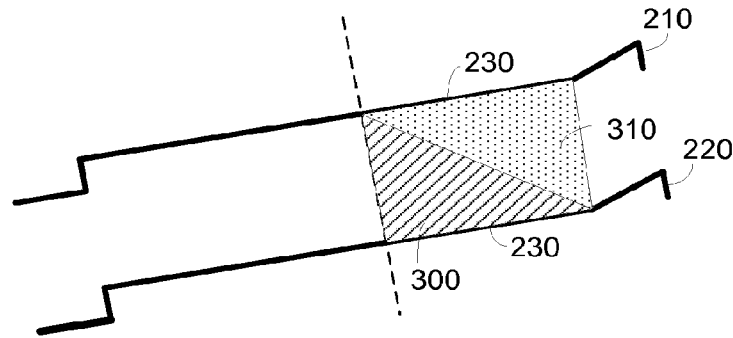

In the event that in stage 4050 the pair of points for cross section n and the pair of points selected for cross section n+1, as indicated by index pointer p, are of the same type, in stage 4060 3D faces are created connecting the pairs of points on cross section 210 to the pairs of points on cross section 220. In an exemplary embodiment the faces represent triangular shapes as illustrated in FIG. 5C, in which a pair of opposing triangle faces 300, 310 connect link 230 of cross section 210 to link 230 of cross section 220. In stage 4135, the faces generated are assigned a rendering based on the link code or other user input as described above in relation to stage 4040. The rendering comprises an appropriate material definition such as shading, color and texture. The above has been described as assigning a face rendering for each generated face, however this is not meant to be limiting in any way. The rendering may equally be assigned to a mesh representation of the appropriate faces without exceeding the scope of the invention.

In stage 4140, cross section pair of point index, p, is examined to see if the end of the cross section in the defined direction has been reached. In the event that the end of the cross section has not been reached, in stage 4150, the point index p is incremented, and stage 4040 as described above is again performed.

In the event that in stage 4140, the end of the cross section has been reached, in stage 4160 the direction is examined to see if it is leftwards, i.e. the initial direction. In the event that the direction is leftwards, in stage 4170 the direction is reset to rightwards, the point index is reset to the centerline, and stage 4040 as described above is performed.

In the event that in stage 4160 the direction is not leftwards, i.e. the rightwards direction has also been performed, in stage 4180 the cross section index n is incremented, and stage 4020 as described above is performed.

In the event that in stage 4050 the pair of points for cross section n and the pair of points selected for cross section n+1, as indicated by index pointer p, are not of the same type, in stage 4070 a point on cross section n+1 whose type matches the second point of the pair of points on cross section n is searched for. The search begins at the index pointer and proceeds in the current direction. In stage 4080, the search of stage 4070 is examined to see whether a point on cross section n+1 whose type matches the second point of the pair of points on cross section n is found.

Figure 5D:
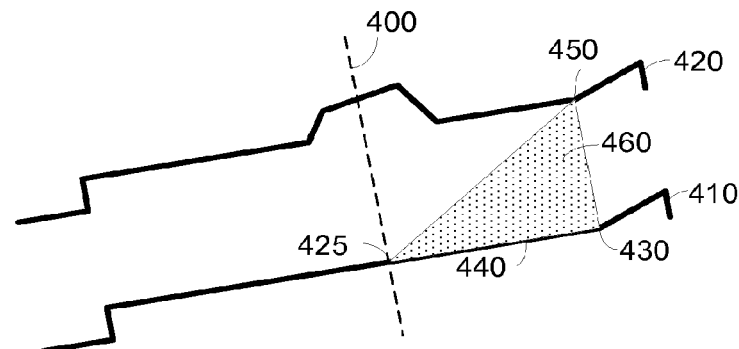
FIGS. 5D-5E illustrate stages in converting GIS information associated with a proposed road surface to a three dimensional visual entity in accordance with a principle of the current invention where the pairs of points are not of the same type.

In the event that a point is found on cross section n+1 whose type matches the second point of the pair of points on cross section n, in stage 4090 a triangular 3D face is created connecting the found point on cross section n+1 to the pair of points on cross section n. This is illustrated in FIG. 5D, in which a first cross section 410 and a second cross section 420 are shown along a centerline 400. First cross section 410 and second cross section 420 are dissimilar, exhibiting differing numbers of points. Point 450 of second cross section 420 exhibits a type, or attribute, of a beginning of a retrograde, which is the same as the type, or attribute of point 430 on first cross section 410. Point 430 defines a link 440 of cross section 410 in cooperation with a point 425 on centerline 400. Thus, triangle face 460 is created by the 425, 430 and 450 as described in stage 4090.

In stage 4100, triangular 3D faces are created by utilizing pairs of points of cross section n+1 beginning with point 450 in reverse of the current direction towards centerline 400. The triangular faces all share a common vertex of point 425, i.e. first of the pairs of points on cross section n. Triangular 3D faces are drawn to fill in the missing sections not drawn in stage 4090. Stage 4135 is performed to render the generated faces based on the link code as described above.

Figure 5E:
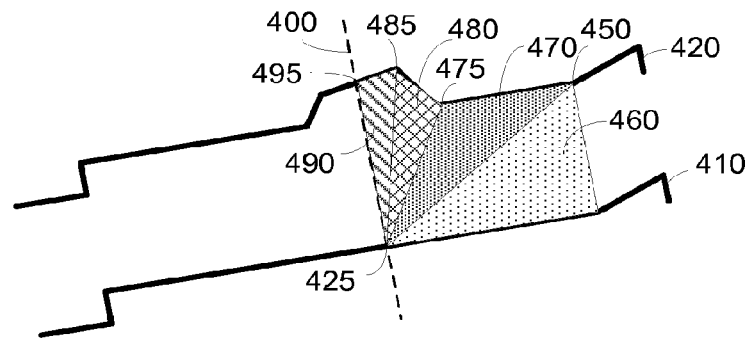

The operation of stage 4100 is illustrated in FIG. 5E, in which first cross section 410 and second cross section 420 are shown along centerline 400. Points 425 and 450, as described above in relation to FIG. 5D are shown, and triangular face 460 is further shown for reference. Triangular face 470 is created from point 450, and a point 475 representing the next road surface point in the direction of centerline 400 and point 425. Triangular face 480 is created from point 475, and a point 485, representing the next road surface point in the direction of centerline 400 from point 475, and point 425. Triangular face 490 is created from point 485, and a point 495, representing the intersection with centerline 400, and point 425.

In the event that in stage 4080 a point is not found on cross section n+1 whose type matches the second point of the pair of points on cross section n, in stage 4110 the base cross section of search is reversed. In particular, a point on cross section n whose type matches the second point of the pair of points on cross section n+1 is searched for. The search begins at the index pointer and proceeds in the current direction.

In stage in stage 4120 a triangular 3D face is created connecting the found point on cross section n to the pair of points on cross section n+1, in a manner similar to that explained above in relation to stage 4090 and FIG. 5D. In stage 4130, triangular 3D faces are created by utilizing pairs of points of cross section n, beginning with the point utilized in stage 4120, and proceeding in reverse of the current direction towards the centerline. The triangular faces all share a common vertex of the first of the pair of points on section n+1, where the first of the pair of points is closest to the centerline. Triangular 3D faces are drawn to fill in the missing sections not drawn in stage 4120. The operation of stage 4130 is similar to the operation of stage 4100 and as described in relation to FIG. 5E, however the first and section cross sections are revered. Stage 4135 is performed to render the generated faces based on the link code as described above.

Figure 5F:
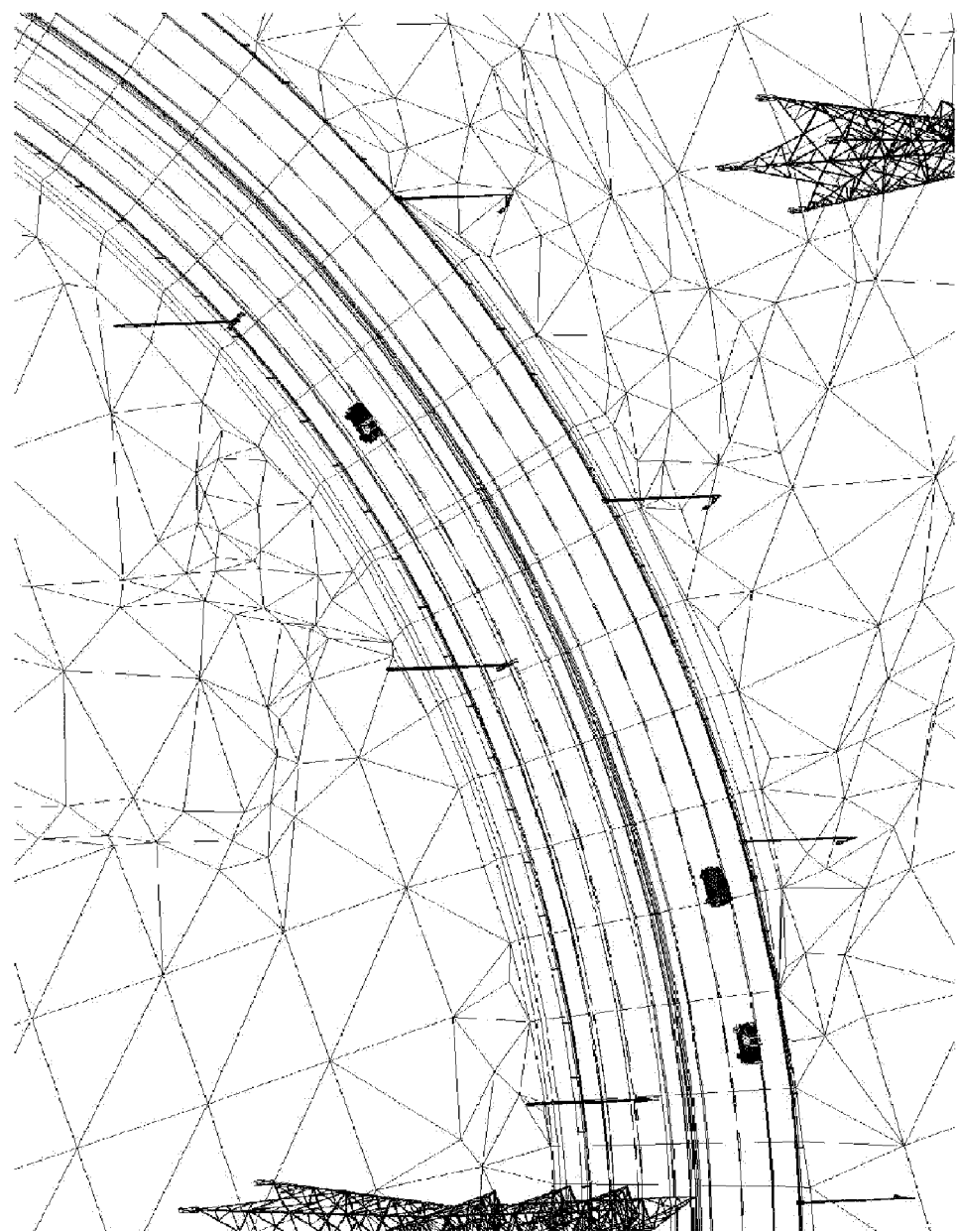
FIG. 5F illustrates a proposed road surface presentation by a combination of 3 dimensional faces in accordance with a principle of the current invention.

Thus, the method of FIG. 5A enables a 3D representation of a road surface by creating 3D faces connecting points of similar type as illustrated in FIG. 5F. In particular the 3D faces receive a rendering based on the link code thereby automatically and conveniently shading or coloring the faces so that different materials appear differently in the resultant display.

Figure 6:
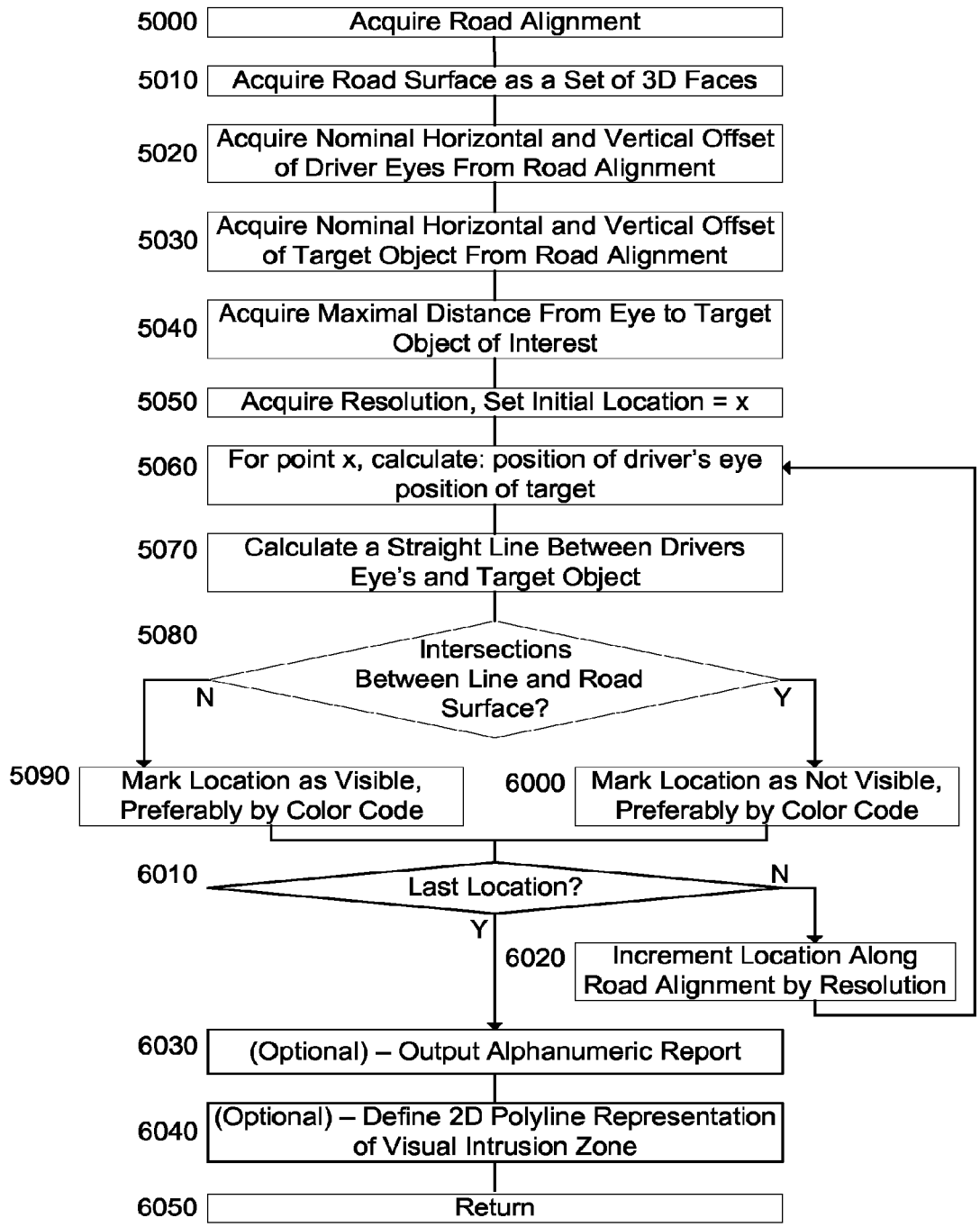
FIG. 6 illustrates a high level flow chart of a method of displaying visibility zones and invisibility zones in accordance with a principle of the current invention.

FIG. 6 illustrates a high level flow chart of a method of displaying visibility zones and invisibility zones in accordance with a principle of the current invention. The method enables roadway sight distances for stopping, passing and other critical maneuvers calculated in the CAD and/or GIS system to be viewed along with, and integrated into, the visual display of the scene-graph.

In stage 5000, the road alignment for which visibility and invisibility zones are to be displayed is acquired. In one embodiment, the road alignment acquired comprises a horizontal alignment and a vertical profile. In another embodiment the road alignment acquired comprises an existing 3D polyline. In one further embodiment, the road alignment is acquired from an external database. In yet another further embodiment, the road alignment is acquired from LandXML formatted file. In an exemplary further embodiment, the LandXML formatted file is stored on GIS or CAD database memory device 40 of FIG. 1.

In stage 5010, the road surface as a set of 3D faces is acquired. In one embodiment the set of 3D faces is generated from a drawing, and in another embodiment the set of 3D faces is generated from the surface objects of a drawing. Preferably, the 3D faces are generated by the operation of the method of FIG. 5A from the road alignment acquired in stage 5000. In another embodiment, the set of 3D faces is retrieved from a file, such as a LandXML file, DTM data format file or DEM data format file. The file may be stored on an external database or on GIS or CAD database memory device 40 of FIG. 1.

In stage 5020, the nominal horizontal and vertical offsets of the driver's eyes from the road alignment, whose visibility is to be displayed, is acquired. In an exemplary embodiment, the nominal horizontal and vertical offset is input via user input device 50, and stored on memory 70 as a variable denoted EyeOffest.

In stage 5030, the horizontal and vertical offsets of the target object, whose visibility in relation to the driver's eyes of stage 5020 is to be determined, is acquired. In an exemplary embodiment, the nominal horizontal and vertical offset is input via user input device 50, and stored on memory 70 as a variable denoted TargetOffest.

In stage 5040, the maximum distance of interest between the driver's eyes of stage 5020 and the target object is acquired. The maximum distance represents the further distance between the driver's eyes and the target object for which visibility is to be tested. In an exemplary embodiment, the maximum distance is input via user input device 50, and stored on memory 70 as a variable denoted SightDistance. In another embodiment these distances are determined automatically by reference to a roadway design speed and tables of sight distances specified for specific design speeds according to local standards—for example AASHTO or other governmental geometric highway design standards.

In stage 5050, the resolution of measurement desired is acquired. In an exemplary embodiment, the resolution of measurement is input via user input device 50, and stored on memory 70 as a variable denoted DesRes. Additionally, the location of the driver is set to an initial location, denoted x.

In stage 5060, the position of the driver's eyes is determined as a function of location x, +EyeOffset as described above in relation to stage 5020. The position of the object is determined as a function of location x+Sightdistance as described above in relation to stage 5040 +TargetOffset as described above in relation to stage 5030.

In stage 5070 a straight line is created between the driver's eyes and the target object. In stage 5080, all intersections, if any, between the straight line created in stage 5070 and the road surface are identified. In the event that no intersections are found, in stage 5090 location x is marked as visible, preferably by coloring the area on the 3D display and further preferably coloring the area green. Additionally, a record of the location and results is stored in memory 70. In the event that at least one intersection is found, in stage 6000 location x is marked as invisible, preferably by coloring the area on the 3D display and further preferably coloring the area red. Additionally, a record of the location and results is stored in memory 70.

After the operation of stages 5090 and 6000, respectively, in stage 6100 location x is compared with a last location. In the event location x is not the last location, in stage 6020 the location of the driver is incremented by the resolution, DesRes as described above in relation to stage 5050, and stage 5060 as described above is performed.

In the event that in stage 6010 location x is the last location to be checked for visibility, in optional stage 6030 an alphanumeric report for each location, including eye and target positions and visibility status is output. In optional stage 6040, a 2D polyline representation of the zone of visual intrusion is defined by connecting all of the straight lines of stage 5070, both where there is visibility as noted in stage 5090 and where there is no visibility as noted in stage 6000, to form a closed polygon and projecting it to its lowest elevation. In stage 6050 the routine returns.

Figure 7:
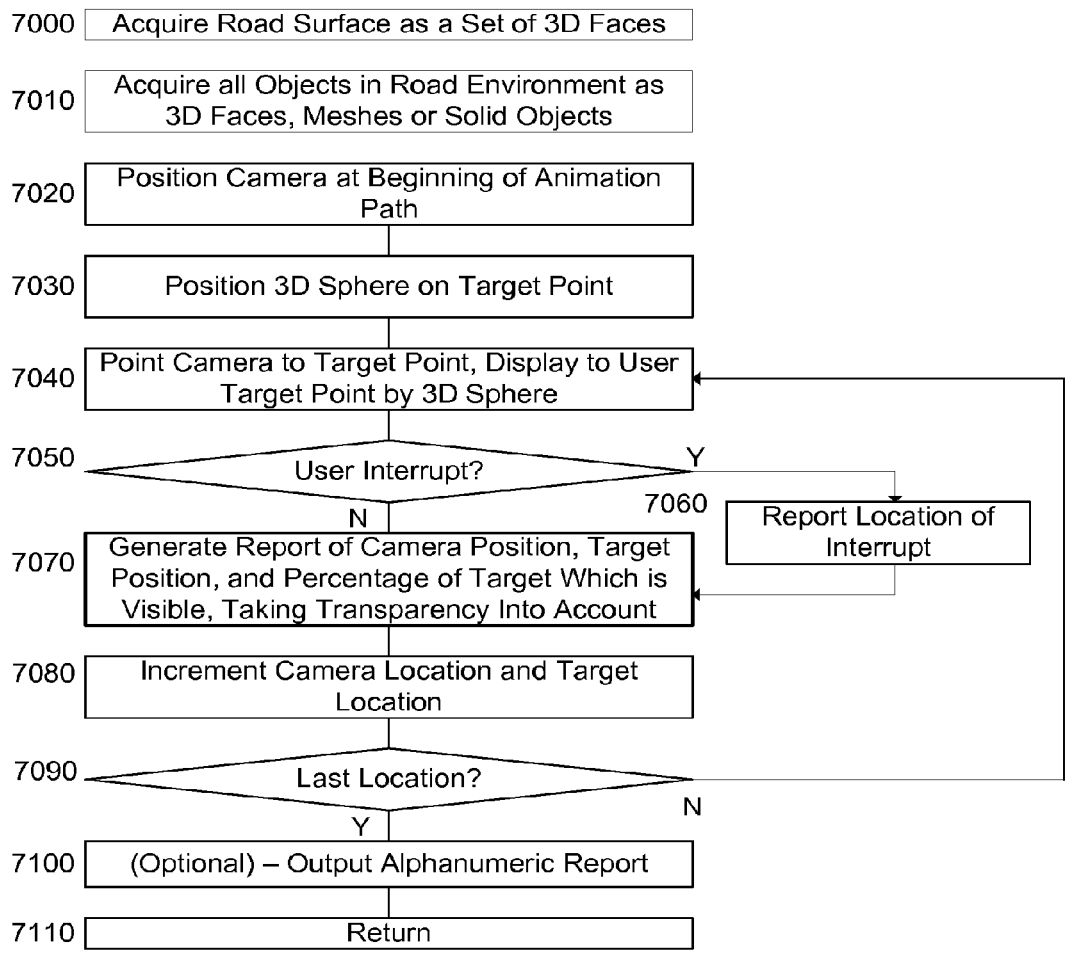
FIG. 7 illustrates a high level flow chart of a method of reporting visibility zones, invisibility zones and partial invisibility zones via a 3D simulator in accordance with a principle of the current invention.

FIG. 7 illustrates a high level flow chart of a method of reporting visibility zones, invisibility zones and partial invisibility zones via a 3D simulator in accordance with a principle of the current invention. The method of FIG. 7 is intended for use with a 3D simulator in which a road surface as a set of 3D faces is supplied. In one embodiment the set of 3D faces is generated from a drawing, and in another embodiment the set of 3D faces is generated from the surface objects of a drawing. Preferably, the 3D faces are generated by the operation of the method of FIG. 5A. In another embodiment, the set of 3D faces is retrieved from a file, such as a LandXML file, DTM data format file or DEM data format file. The file may be stored on an external database or on GIS or CAD database memory device 40 of FIG. 1.

In stage 7000, the road surface, or other infrastructure, is acquired as a set of the 3D faces. In an exemplary embodiment the road surface is acquired by the method of FIG. 5A. In stage 7010 all objects in the road environment, or other infrastructure, are acquired as 3D faces, meshes or solid objects. In an exemplary embodiment, the objects are supplied from a CAD system and converted to 3D objects by the method of FIGS. 2A and 3. Preferably, the transparency or opaqueness of the object is further acquired, as will be described further hereinto below.

In stage 7020, a virtual camera of the 3D simulator is positioned at the beginning of the animation path and in stage 7030, a 3D target sphere, or other pointing object, is positioned on the target point by a user, preferably via user input device 50.

In stage 7040, the virtual camera is pointed towards the 3D target sphere of stage 7010, and the view is displayed to the user on monitor 60. Thus, the user can notice if the target point is fully visible or whether it is partially or totally obscured. It is to be understood that the objects in the road environment have been loaded with a transparency quotient, and the transparency is taken into account in the display. Thus, for example, if the 3D target sphere covers 100 pixels on the screen, and an object which blocks 50 of the 3D target sphere pixels is located between the camera and the 3D target sphere, i.e 50% of the pixels, with the object exhibiting a 40% transparency, then 70% of the 3D target sphere is visible.

In stage 7050 a user input, preferably from user input device 50 is checked. Thus, for example, in the event that the target sphere has become invisible, the user can immediately mark the point as problematic by pressing an input key. In the event that a user has pressed a key indicative of an interruption, in stage 7060 a report of the location is displayed. The user may optionally stop the simulation, and review the 3D simulation of the road surface or infrastructure centered on the interrupted location.

In the event that in stage 7050 there is no user input, or after the performance of stage 7060, in stage 7070 a report is generated indicating the camera position, the target position, and optional a serial number of the point. The report further indicates the percentage of the 3D target sphere that is fully visible while taking transparency into account.

In stage 7080, the camera location and the 3D target sphere location are incremented along the animation path. In one embodiment the increment is by a default value, and in another embodiment the increment amount is user selectable.

In stage 7090 the incremented camera location and 3D target sphere location are examined to determine if the last location point has been reported. In the event that the last location has not been reported, stage 7040 as described above is performed.

In optional stage 7100 an alphanumeric report for each location, including camera positions, target positions and visibility status is output. In stage 7110 the routine returns.

Thus the present embodiments enable a method and apparatus for exporting and converting CAD and/or GIS data to a scene-graph abstraction of a virtual reality scene. 3D geometry information and assignments for lighting, coloring, texturing and shading is stored in the scene-graph preferably including an object hierarchy with uniquely identified objects and sub-objects in the scene-graph. In an exemplary embodiment animation control is provided for objects which move over time.

The invention further provides for a viewing application that takes the generated scene-graph and displays it on a monitor. In an exemplary embodiment the viewing application displays the scene-graph via a graphics card subsystem of a viewing computer. Preferably, all processing required for viewing of visual information occurs in the graphics pipeline of the viewing computer. Further preferably the graphics pipeline utilizes either OpenGL or DirectX protocols, with an optimizing decision regarding which of the protocols to be used being implemented at runtime.

In one embodiment, spatial analysis run in CAD and/or GIS systems and stored in associated files are exported and converted to the scene-graph. Thus, for example, roadway sight distances for stopping, passing and other critical maneuvers calculated in the CAD and/or GIS system may be viewed along with, and integrated into, the visual display of the scene-graph.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

We claim:

1. A computer implemented method of proximity detection comprising:
    defining a set of three dimensional entities in a screen-graph for analysis;
    for each entity in said defined set, creating a bounding box;
    setting said created bounding box to a first predetermined value;
    for each of said set created bounding boxes, performing an intersection test with at least one other bounding box;
    in the event that an intersection is found by said performed intersection test, for each face of each entity in the intersection enlarging the face by a second predetermined value;
    for each of said enlarged faces, performing an intersection test with each of said other enlarged faces; and
    in the event that an intersection is found by said performed intersection test of said enlarged faces, marking a collision.

2. The computer implemented method according to claim 1, wherein said first and second predetermined values are each a proximity value determining a collision.

3. The computer implemented method according to claim 1, wherein said first predetermined value is substantially the same as said second predetermined value.

4. The computer implemented method according to claim 3, wherein said first and second predetermined values are each a proximity value determining a collision.

5. A computing system for visually displaying proximity detection, comprising a computer and a monitor, the computer being arranged to:
    define a set of three dimensional entities in a screen-graph for analysis;
    for each entity in said defined set, create a bounding box;
    set said created bounding box to a first predetermined value;
    for each of said set created bounding boxes, perform an intersection test with at least one other bounding box;
    in the event that an intersection is found by said performed intersection test, for each face of each entity in the intersection enlarge the face by a second predetermined value;
    for each of said enlarged faces, perform an intersection test with each of said other enlarged faces; and
    in the event that an intersection is found by said performed intersection test of said enlarged faces, mark a collision by displaying, on the monitor, a collision representing marker overlaying a display of said screen-graph.

6. The computing system according to claim 5, wherein said collision representing marker comprises a 3 dimensional sphere marker.

7. The computing system according to claim 5, wherein said first and second predetermined values are each a proximity value determinative of a collision.

8. The computing system according to claim 5, wherein said first predetermined value is substantially the same as said second predetermined value.

9. The computing system according to claim 8, wherein said first and second predetermined values are each a proximity value determinative of a collision.

10. A non-transitory computer readable medium containing instructions for controlling a data processing system to perform a method of proximity detection, the method comprising:
    defining a set of three dimensional entities in a screen-graph for analysis;
    for each entity in said defined set, creating a bounding box;
    setting said created bounding box to a first predetermined value;
    for each of said set created bounding boxes, performing an intersection test with at least one other bounding box;
    in the event that an intersection is found by said performed intersection test, for each face of each entity in the intersection enlarging the face by a second predetermined value;
    for each of said enlarged faces, performing an intersection test with each of said other enlarged faces; and
    in the event that an intersection is found by said performed intersection test of said enlarged faces, marking a collision.

11. The non-transitory computer readable medium according to claim 10, wherein said first and second predetermined values are each a proximity value determining a collision.

12. The non-transitory computer readable medium according to claim 10, wherein said first predetermined value is substantially the same as said second predetermined value.

13. The non-transitory computer readable medium according to claim 12, wherein said first and second predetermined values are each a proximity value determining a collision.

* * * * *